United States Patent
Garcia et al.

(10) Patent No.: US 6,420,893 B1
(45) Date of Patent: Jul. 16, 2002

(54) METHODS FOR MEASURING CONTAMINANT MOBILE IONS IN DIELECTRIC MATERIALS

(75) Inventors: James Garcia; Michael McBride, both of Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/904,004

(22) Filed: Jul. 12, 2001

(51) Int. Cl.$^7$ .............................................. G01R 31/26
(52) U.S. Cl. ........................... 324/765; 422/88; 117/98; 205/775
(58) Field of Search .................... 422/88; 324/765; 117/98; 438/476; 205/775

(56) References Cited

U.S. PATENT DOCUMENTS

| | | | |
|---|---|---|---|
| 4,978,915 A | * 12/1990 | Andrews, Jr. et al. | 324/765 |
| 4,980,301 A | * 12/1990 | Harrus et al. | 438/476 |
| 5,275,687 A | * 1/1994 | Choquette et al. | 117/98 |
| 5,519,334 A | 5/1996 | Dawson | |
| 5,773,989 A | * 6/1998 | Edelman et al. | 324/765 |
| 5,804,981 A | 9/1998 | Lowell et al. | |
| 5,963,783 A | 10/1999 | Lowell et al. | |
| 6,011,404 A | * 1/2000 | Ma et al. | 324/765 |
| 6,073,501 A | 6/2000 | Rohner | |

OTHER PUBLICATIONS

Wolf, Stanley Ph.D. and Richard N. Tauber, Ph.D, "Silicon Processing for the VLSI Era", 1986, pp. 220–228, vol. 1: Process Technology, Lattice Press, Sunset Beach, California.

* cited by examiner

Primary Examiner—Jill Warden
Assistant Examiner—Brian Sines
(74) Attorney, Agent, or Firm—Ingrassia Fisher & Lorenz

(57) ABSTRACT

In accordance with the present invention, a method is provided for measuring contaminant mobile ions in a dielectric portion of a semiconductor. The method is comprised of elevating a temperature of the dielectric portion of the semiconductor and exposing the dielectric portion of the semiconductor to a mobilizing fluid having contaminant releasing atoms that assist in mobilizing the contaminant mobile ions within the dielectric portion of the semiconductor. After elevating the temperature of the dielectric portion and exposing the dielectric portion to mobilizing fluid, the contaminant mobile ions within the dielectric portion of the semiconductor are measured according to the present invention.

20 Claims, 3 Drawing Sheets

METHODS FOR MEASURING CONTAMINANT MOBILE IONS IN DIELECTRIC MATERIALS

TECHNICAL FIELD

The present invention generally relates to methods for measuring contaminant mobile ions in dielectric materials. More particularly, the present invention relates to methods for measuring contaminant mobile ions in a dielectric portion of a semiconductor.

BACKGROUND OF THE INVENTION

Generally, semiconductor devices are formed by patterning substantially coplanar conductive traces or interconnects onto the surfaces of substrates followed by layering of the substrates. The substrates are typically formed of dielectric materials or include portions of dielectric material (e.g., dielectric layers or films). The portions of dielectric material (i.e., dielectric portions) are included on the substrates to electrically separate interconnects of the layered substrates and exemplary dielectric materials used for semiconductor devices include, but are not limited to, silicon dioxide (oxide) and silicon nitride.

Due to processing of the substrates and other conditions, the dielectric portions often contain variable levels of electrically charged contaminant mobile ions. Such electrically charged ions within the dielectric portions of the substrates can reduce reliability in semiconductor devices such as metal oxide semiconductor (MOS) devices. As an example, ionized alkali metal atoms (e.g., $Na^+$ and $K^+$) are mobile in oxide layers, and move through gate oxides of MOS devices under the influence of the electric fields generated between gate electrodes and substrates during MOS operation. Over time, mobile ions in gate oxides can drift toward interfaces between the gate oxides and underlying substrates and the resulting changes in MOS device threshold voltage levels may become significant enough to cause electrical performance degradation in circuits that incorporate the MOS device.

To assist in maintaining low levels of mobile ion contamination, it is desirable to measure the contamination. Capacitance/Voltage (C/V) methods, bias temperature treatment methods and other similar methods are commonly employed to monitor such contamination by inducing drift or mobilization of mobile ions within the dielectric materials and measuring differences in electric potential or voltage caused by the mobile ions. Examples of such methods are discussed in commonly owned U.S. Pat. No. 5,963,783, issued to Lowell et al on Oct. 5, 1999, which is herein fully incorporated by reference. These methods commonly employed to measure contamination can be improved if the differences in electric potential upon which contamination measurements may be based take into account non-contaminant mobilized ions or charges and/or contaminant mobile ions that generally remained immobilized during previous methods employed to conduct contamination measurements.

In view of the foregoing, it is desirable to provide methods for measuring contaminant mobile ions in dielectric materials. In addition, it is desirable to provide methods for measuring contaminant mobile ions in a dielectric portion of a semiconductor. Furthermore, additional desirable features will become apparent to one of ordinary skill in the art from the drawings, foregoing background of the invention and following detailed description of the drawings, and appended claims.

SUMMARY OF THE INVENTION

In accordance with the present invention, a method is provided for measuring contaminant mobile ions in a dielectric portion of a semiconductor. The method is comprised of elevating a temperature of the dielectric portion of the semiconductor and exposing the dielectric portion of the semiconductor to a mobilizing fluid having contaminant releasing atoms after elevating the temperature of the dielectric portion, thereby assisting in mobilizing the contaminant mobile ions within the dielectric portion of the semiconductor. The method is further comprised of measuring contaminant mobile ions within the dielectric portion of the semiconductor after elevating the temperature of the dielectric portion and exposing the dielectric portion to the mobilizing fluid.

BRIEF DESCRIPTION OF THE DRAWINGS

The present invention will hereinafter be described in conjunction with the appended drawing figures, wherein like numerals denote like elements, and.

DETAILED DESCRIPTION OF THE DRAWINGS

The following detailed description of the drawings is merely exemplary in nature and is not intended to limit the invention or the application and uses of the invention. Furthermore, there is no intention to be bound by any theory presented in the preceding background of the invention or this detailed description of the drawings.

Figure 1:
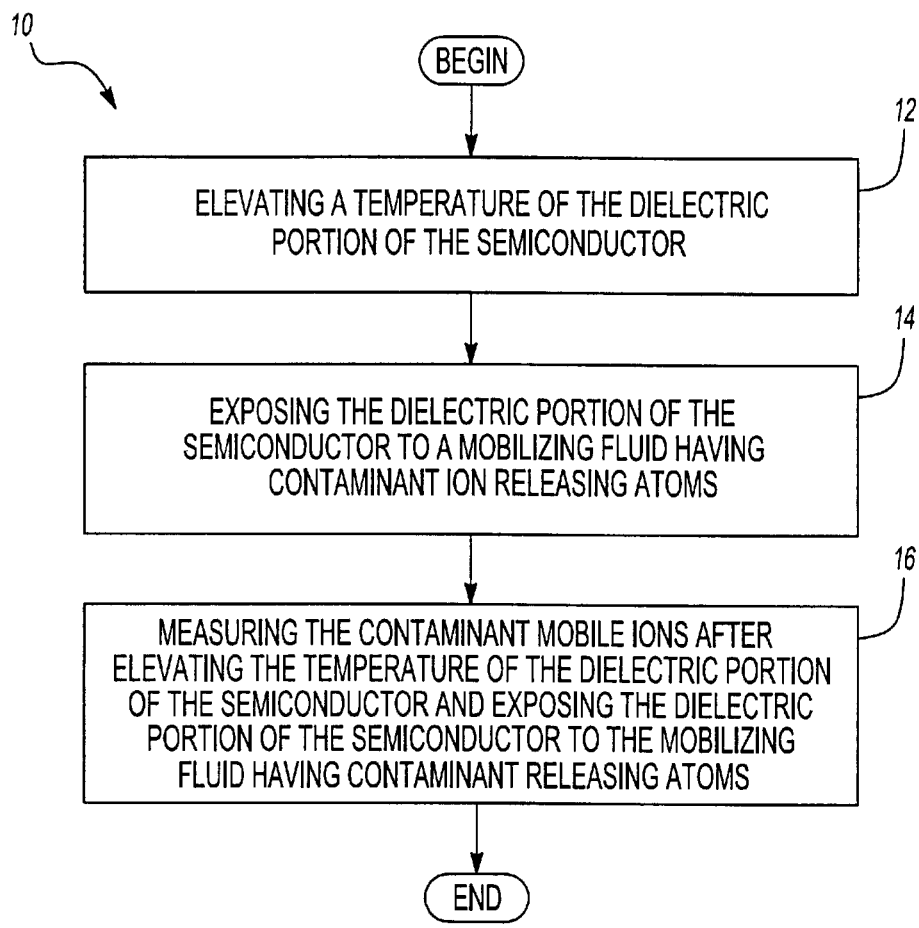
FIG. 1 is a flowchart of a method for measuring contaminant mobile ions in a dielectric portion of a semiconductor according to an exemplary embodiment of the present invention.

Referring to FIG. 1, a method 10 for measuring contaminant mobile ions in a dielectric portion of a semiconductor is illustrated according to an exemplary embodiment of the present invention. The method 10 is comprised of elevating a temperature (i.e., increasing the temperature) of the dielectric portion of the semiconductor 12 and exposing the dielectric portion of the semiconductor to a mobilizing fluid having contaminant ion releasing atoms 14. The combination of elevating the temperature of the dielectric portion of the semiconductor 12 and exposing the dielectric portion of the semiconductor to the mobilizing fluid having contaminant ion releasing atoms 14 assists in mobilizing the contaminant mobile ions within the dielectric portion of the semiconductor. As used in this detailed description of the drawings, the terms "mobilize" or "mobilizing" can mean preparing the contaminant ions for movement or actual movement of the contaminant ions unless otherwise specified herein. After mobilizing the contaminant mobile ions in the dielectric portion of the semiconductor (i.e., temperature elevation and exposure to the mobilizing fluid), the method 10 for measuring contaminant mobile ions in the dielectric portion of the semiconductor continues with measuring the contaminant mobile ions within the dielectric portion of the semiconductor 16.

Figure 2:
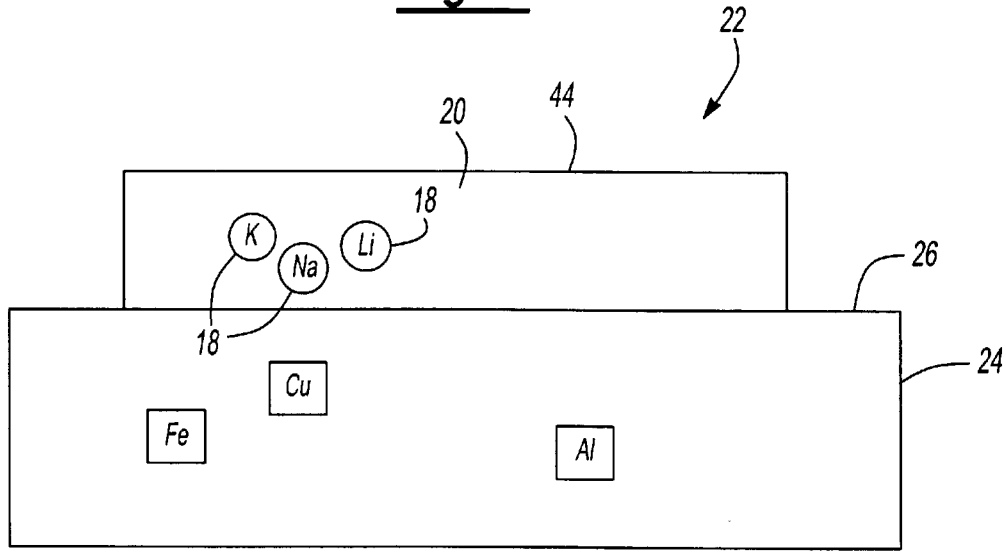
FIG. 2 is an enlarged view of a semiconductor with contaminant mobile ions in the dielectric portion of the semiconductor.

Referring to FIG. 2, the contaminant mobile ions 18 in the dielectric portion 20 of the semiconductor 22 can be measured with any number of devices, systems and techniques. In addition, any number of contaminant mobile ions 18 can be measured in the dielectric portion 20 of the semiconductor 22 in accordance with the present invention. For example, contaminant mobile ions 18 of ionized sodium ($Na^+$), ionized potassium ($K^+$), ionized lithium ($Li^+$) and the like, can be measured in the dielectric portion 20 of silicon dioxide ($SiO_2$) that is thermally grown on one or more sides of a substrate 24 of silicon (Si). However, the dielectric portion 20 can be formed of any dielectric material including, but not limited to, aluminum oxides, silicon nitride, oxynitride composites and the substrate 24 can be any number of materials such as GaAs, GaP, InP, InSb, CdS and CdTe. Additionally, the dielectric portion 20 can substantially cover the entire surface 26 of the substrate 24 or can be formed as a portion (e.g., a layer or film) of the substrate 24 using deposition, dielectric growth or other suitable technique. As used in this detailed description of the drawings, the semiconductor 22 can have any number of configurations and forms, and the term "semiconductor" is meant to include all semiconductor devices or portions thereof such as semiconductor wafers, substrates and the like prior to or during any stage of processing. Furthermore, the elevating of the temperature of the dielectric portion 20 of the semiconductor 22 and the exposing of the dielectric portion 20 of the semiconductor 22 to the mobilizing fluid can be performed with any number of techniques, devices and systems.

Figure 3:
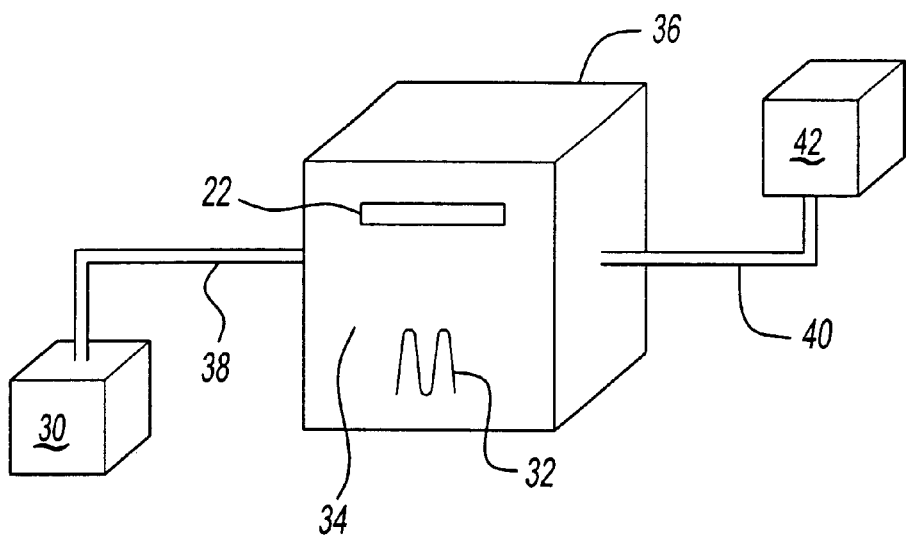
FIG. 3 is a mobilization unit that can be utilized to perform the method for measuring contaminant mobile ions in the dielectric portion of the semiconductor illustrated in the flowchart of FIG. 1.

For example and with reference to FIG. 3, a mobilization unit 28 is illustrated that is configured to elevate the temperature of the dielectric portion of the semiconductor 22 and expose the dielectric portion of the semiconductor 22 to the mobilizing fluid. The mobilization unit 28 is preferably comprised of a fluid source 30 and a heat source 32 in operable communication with a chamber 34 formed in a housing 36 that is configured to receive the semiconductor 22 with a support (not shown), such as a quartz boat or other suitable support. Alternatively, the chamber 34 can be configured to receive the semiconductor 22 without a support. The chamber 34 of the mobilization unit 28 is preferably connected to the fluid source 30 that is providing the mobilizing fluid with conventional tubing 38. However, it should be appreciated by one of ordinary skill in the art that the chamber 34 can be provided with a variety of housings and the heat source 32, fluid source 30 and chamber 34 can be separate or integrated components that are configured as described in this detailed description of the drawings.

The heat source 32 can be one or more heating elements or heating devices, which is configured to increase the temperature of at least the dielectric portion the semiconductor 22 (e.g., a combustion heater, an electric heater or other suitable heaters). Alternatively, the chamber 34 can be configured for insertion into a furnace (not shown) that is configured as the heat source for elevating the dielectric portion of the semiconductor 22. Preferably, the heat source 32 elevates the temperature of at least the dielectric portion to a temperature that is greater than about two hundred degrees Celsius (200° C.) and less than about one thousand degrees Celsius (1000° C.). More preferably, the heat source 32 elevates the temperature of at least the dielectric portion to a temperature that is greater than about three hundred degrees Celsius (300° C.) and less than about five hundred degrees Celsius (500° C.). Even more preferably, the heat source 32 elevates the temperature of at least the dielectric portion to about four hundred degrees Celsius (400° C.).

Once the heat source 32 elevates the temperature of at least the dielectric portion of the semiconductor 22, the fluid source 30 preferably exposes at least the dielectric portion of the semiconductor 22 to the mobilizing fluid that assists in mobilizing the mobile contaminant ions. Preferably, the fluid source 30 exposes substantially all or the entire semiconductor 22 to the mobilizing fluid. The mobilizing fluid includes contaminant ion releasing atoms for releasing mobile contaminant ions that have been immobilized by charge traps within the dielectric portion, thereby assisting in mobilizing the contaminant mobile ions. Preferably, the elevation of the temperature (i.e., heating) of the dielectric portion and the exposure of the dielectric portion to the mobilizing fluid are conducted substantially simultaneously. However, the heating of the dielectric portion and exposure of the dielectric portion to the mobilizing fluid can be conducted during separate periods.

In a preferred embodiment, the fluid source 30 provides the mobilizing fluid to the chamber as a gas that includes about ten percent (10%) hydrogen gas ($H_2$) and about ninety percent (90%) nitrogen gas ($N_2$). It is believed that the hydrogen gas ($H_2$) provides hydrogen ions ($H^+$), which destroy the charge traps and/or displace the contaminant mobile ions that are immobilized by the charge traps. However, the mobilizing fluid can be comprised of other fluids or combination of fluids that are configured to assist in mobilizing the contaminant mobile ions. For example, as alternatives to nitrogen gas ($N_2$), hydrogen gas ($H_2$) may be provided with other gasses such as helium (He) gas, argon (Ar) gas or the like. Additionally, it is contemplated that other fluids that contain contaminant ion releasing atoms other than hydrogen may be used to assist in mobilizing contaminant ions. It is further contemplated that the fluid may be provided as a medium other than only as a gas, such as a gas and liquid combination, only a liquid, a gel, semi-solid or the like.

As previously described in this detailed description of the drawings, the chamber 34 is configured for receiving the mobilizing fluid from the fluid source 30 and is also preferably configured to maintain a substantial amount of the mobilizing fluid within the chamber 34 such that the dielectric portion is exposed to a concentrated environment of contaminant ion releasing atoms. To assist in exposing the dielectric portion to the mobilizing fluid, the mobilization unit 28 can include an exhaust 40 for removing the contents of the chamber 34 prior to the introduction of the mobilizing fluid. The exhaust 40 can also be configured with a burner 42 for use in burning off excess or used mobilizing fluid as it is purged from the chamber 34.

The dielectric portion of the semiconductor 22 is heated and exposed to the concentrated mobilizing fluid within the chamber 34 for a predetermined time. For example, the dielectric portion of the semiconductor 22 is heated and exposed to the concentrated mobilizing fluid within the chamber 34 for about one (1) minute to about one (1) hour, and more preferably for approximately fifteen (15) minutes. However, the exposure to the mobilizing fluid can be for a period that is greater than about one (1) hour and less than about one (1) minute in accordance with the present invention. In addition to mobilizing the mobile contaminant ions, it is believed that the combination of the temperature elevation and the exposure to the mobilizing fluid for a predetermined period may destroy non-alkali or non-contaminant ions or charges that affect voltages or potentials that may be induced across the dielectric portion during the measurements of the contaminant mobile ions.

After mobilization of the mobile contaminant ions in the mobilization unit 28, the semiconductor 22 is typically allowed to cool, preferably to a temperature between zero degrees Celsius (0° C.) and one hundred degrees Celsius (100° C.), and more preferably to about twenty degrees Celsius (20° C.). During or after cooling, at least one measurement of the contaminant mobile ions is performed on the semiconductor 22. The measurement of the contaminant mobile ions can be accomplished with any number of mobile ion measurement units and techniques. Preferably, the measurement and subsequent measurements is performed with a corona oxide semiconductor (COS) mobile ion measurement unit that measures potential across a portion (e.g., an exposed or outer surface) of the dielectric portion 20.

Referring to FIG. 2 and according to a preferred exemplary embodiment, three potentials are measured across the surface 44 of the dielectric portion 20, at least two of which are used to determine contaminant mobile ion charge ($Q_m$) More specifically, a first potential is measured across the surface 44 of dielectric portion 20 upon transport of the semiconductor 22 to the measurement unit and prior to further treatment of the dielectric portion 20. After the first potential is measured in accordance with the present invention, a corona charge or "virtual gate" is produced upon the surface 44 of the dielectric portion 20, which may be positive or negative The comna charge on the surface 44 of the dielectric portion 20 can be produced by ionizing air or other gas molecules and depositing the molecules on the dielectric portion 20 with a corona gun (not shown) or other charge deposition device. The deposit of the corona charge on the surface 44 is preferably repeated with one deposit of a positive charge and a second deposit as a negative charge. After the two corona charge deposits, the temperature of the dielectric portion 20 is elevated to a temperature that is preferably greater than about one hundred and forty degrees Celsius (140° C.) and less than about two hundred and forty degrees Celsius (240° C.) in order to assist in mobilizing the contaminant mobile ions 18.

As the contaminant mobile ions 18 are mobilized with the elevation of temperature and exposure to the mobilizing fluid, the corona charge moves or biases the contaminant mobile ions 18 either toward or away from the surface 44 of the dielectric portion 20 depending upon whether the corona charge is positive or negative. Typically, the contaminant mobile ions 18 are positive such that the contaminant mobile ions 18 are biased away from the corona charge and away from the surface 44 of the dielectric portion 20 when the corona charge is positive. In addition, the contaminant mobile ions 18 are generally biased toward the corona charge and toward the surface 44 of the dielectric portion 20 when the corona charge is negative.

As previously discussed in this detailed description of the drawings, the temperature of at least the dielectric portion 20 is preferably reduced after the biasing of the contaminant mobile ions 18. Once the temperature of at least the dielectric portion 20 is reduced, a potential across the surface 44 of the dielectric portion 20 is measured after the contaminant mobile ions 18 are biased away from the surface 44 and a potential across the surface 44 of the dielectric portion 20 is measured after the contaminant mobile ions 18 are biased toward the surface 44. A difference between the potential measured with the contaminant mobile ions 18 biased away from the surface 44 and the potential measured with the contaminant mobile ions 18 biased toward the surface 44 is determined, which is the contaminant mobile charge ($Q_m$).

It is preferable that the mobile ion contamination of the dielectric portion 20 is measured after formation or deposition of the dielectric portion 20 on the substrate 24, but prior to further processing of the substrate 24. More preferably, mobile ion contamination is measured after oxidation of the substrate 24 to grow or otherwise form the dielectric portion 20 on the substrate 24. Alternatively, however, the mobile ion contamination may be measured at any semiconductor processing stage.

It may be desirable to perform other measurements. For example, it may be desirable to perform charge/voltage (c/v) measurements (Q-V), effective charge ($Q_{eff}$)) measurements, total charge ($Q_{tot}$) measurements, flat band voltage ($V_{fb}$) measurements, interface trap density ($D_{it}$) measurements, generation lifetime ($G_{ife}$) measurements and the like prior to exposing the dielectric portion 20 to heat and/or the mobilizing fluid. It also may be desirable to take a mobile charge ($Q_m$) measurement prior to exposing the dielectric portion 20 to heat and/or the mobilizing fluid such that a comparison can be made between the mobile charge ($Q_m$) prior to such exposure and the mobile charge ($Q_m$) after such exposure as will be subsequently discussed in this detailed description of the drawings. However, it should be understood that the contaminant ion measurements previously described in this detailed description of the drawings are merely preferred exemplary embodiments and other contaminant mobile ion measurement methods may be substituted into and used according to the present invention. For instance, it is contemplated that the mobilization of ions in the mobilizing unit of the present invention can assist in performing mobile ion measurements according to a variety of CN methods or other appropriate methods. It is also contemplated that mobile ion contamination measurements are intended to include a variety of measurements such as voltage measurements, potential measurements or other electrical measurements that are related to mobile ion contamination as well as measurements such as concentration or amount of mobile ion contamination and the like.

Figure 4:
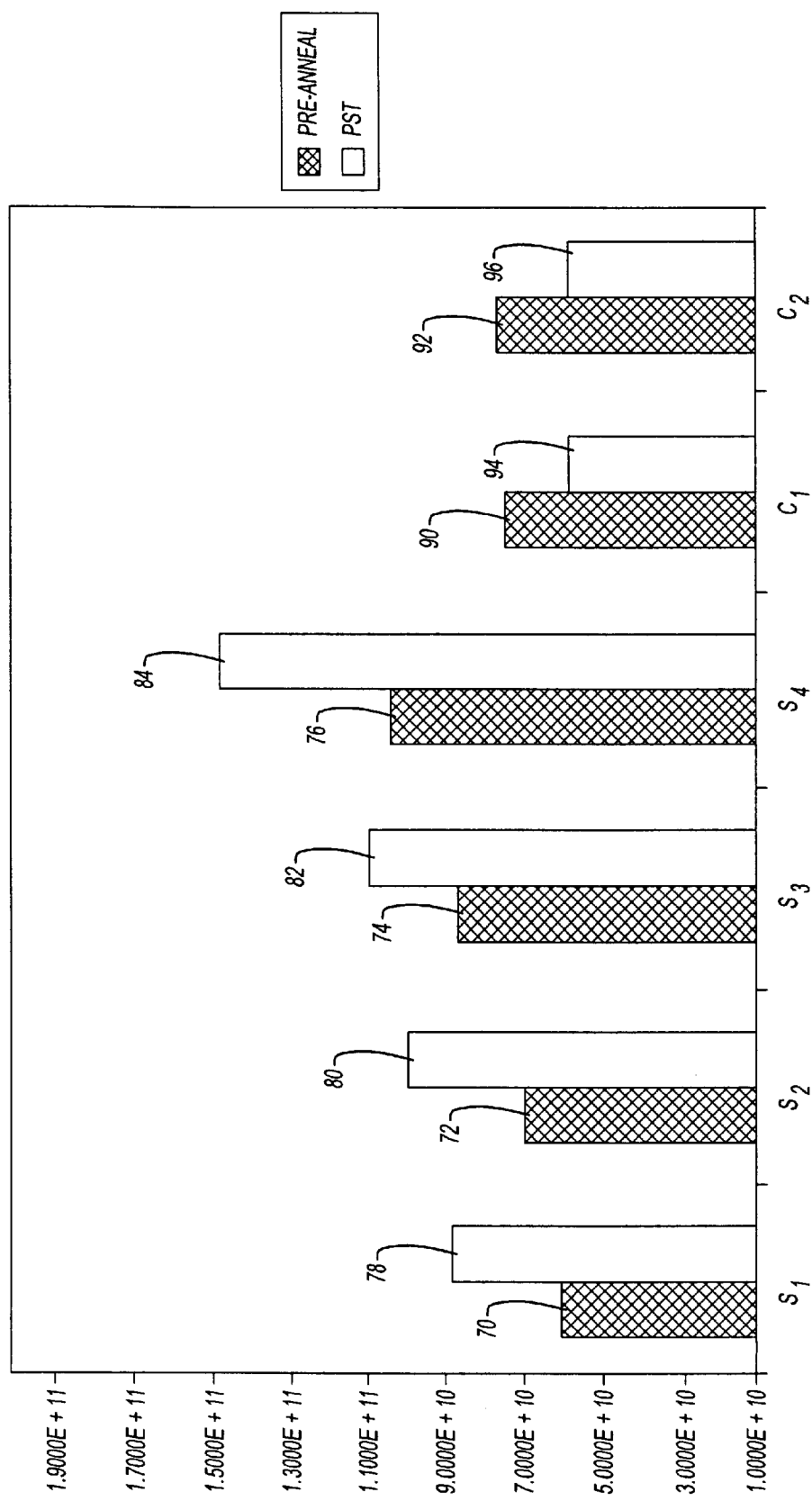
FIG. 4 is a graphical representation of contaminant mobile ion measurements.

Preferably, heating the dielectric portion 20 and exposing the dielectric portion 20 to a mobilizing fluid, which shall also be referred to herein as an annealing of the dielectric portion 20, assists in releasing contaminant ions, thereby improving the accuracy of the contaminant mobile ion measurements. For example, mobile charge ($Q_m$) measurements (70, 72, 74, 76) for several silicon dioxide test samples ($s_1$, $s_2$, $s_3$, $s_4$) performed before annealing, mobile charge ($Q_m$) measurements (78, 80, 82, 84) of the several silicon dioxide test samples ($s_1$, $s_2$, $s_3$, $s_4$) after annealing, mobile charge ($Q_m$) measurements (90,92) of silicon dioxide control samples ($C_1$,$C_2$) performed before annealing and mobile charge ($Q_m$) measurements (94,96) of silicon dioxide control samples ($C_1$,$C_2$) performed after annealing are illustrated in FIG. 4. With continuing reference to FIG. 4 and for illustrative purposes only, the silicon dioxide test samples ($s_1$, $s_2$, $s_3$, $s_4$) were contaminated with variable levels of lithium ($Li^+$) mobile ion contamination. The control samples ($C_1$, $C_2$) were processed in a manner that was substantially similar to the silicon dioxide test samples ($s_1$, $s_2$, $s_3$, $s_4$), but were not contaminated with variable levels of lithium ($Li^+$) mobile ion contamination, thereby providing that the ion contamination levels for the control samples ($C_{11}$ $C_2$) were lower than the test samples ($s_1$, $s_2$, $s_3$, $s_4$). As can be seen in FIG. 4, the annealing caused the mobile charge measurements for the test samples ($s_1$, $s_2$, $s_3$, $s_4$) to increase while causing the mobile charge measurements for the control samples ($C_1$, $C_2$) to decrease. Thus, it is can be appreciated by one of ordinary skill in the art that the annealing assists in providing increase accuracy for detection of contaminant mobile ions and may also assist in minimizing false readings of charges that are not provided by contaminant mobile ions.

It may be desirable to have a method for measuring mobile ion contamination that includes performing mobile ion contamination measurements before and after exposure to a mobilizing fluid. More specifically, it may be desirable to perform a first mobile ion charge ($Q_m$) measurement prior to exposure to heat in the presence of mobilizing fluid and a second mobile ion measurement charge ($Q_m$) measurement after such exposure. Depending on whether the second measurement is greater than or less than the first measurement, additional determinations regarding the actual amounts of mobile ion contamination and the cause of fluctuations in the values of the measurements may be made in accordance with the present invention. For example, mobile charge ($Q_m$) measurements that are increasing after exposure of the dielectric portion to heat and mobilizing fluid may indicate that an excessive amount of charge traps are present in the dielectric portion and measures may be taken to reduce such traps. As another example, mobile charge ($Q_m$) measurements that are decreasing may indicate that an excessive amount of non-contaminant mobile ions are present in the dielectric portion and measures may be taken to reduce such non-contaminant ions.

From the foregoing, it should be appreciated that methods are provided for measuring mobile contaminant ions. In addition, is should be appreciated that methods are provided for measuring contaminant mobile ions in a dielectric portion of a semiconductor. While a preferred exemplary embodiment has been presented in the foregoing detailed description of the drawings, it should be understood that a vast number of variations exist and this preferred exemplary embodiment is merely an example, and it is not intended to limit the scope, applicability or configuration of the invention in any way. Rather, the foregoing detailed description provides those of ordinary skill in the art with a convenient road map for implementing a preferred embodiment of the invention and various changes can be made in the function and arrangements of the exemplary embodiment without departing from the spirit and scope of the appended claims.

What is claimed is:

1. A method for measuring contaminant mobile ions in a dielectric portion of a semiconductor, comprising;
    elevating a temperature of the dielectric portion of the semiconductor;
    exposing the dielectric portion of the semiconductor to a mobilizing fluid after the elevating the temperature of the dielectric portion, the mobilizing fluid including contaminant ion releasing atoms for assisting in mobilizing the contaminant mobile ions within the dielectric portion of the semiconductor; and
    inducing at least one electric potential across a surface of the dielectric portion of the semiconductor and measuring the contaminant mobile ions within the dielectric portion of the semiconductor after elevating the temperature of the dielectric portion of the semiconductor and after exposing the dielectric portion of the semiconductor to the mobilizing fluid.

2. The method for measuring contaminant mobile ions in the dielectric portion of the semiconductor of claim 1, wherein said measuring the contaminant mobile ions within the dielectric portion of the semiconductor is conducted after forming the dielectric portion on a substrate of the semiconductor.

3. The method for measuring contaminant mobile ions in the dielectric portion of the semiconductor of claim 1, wherein said mobilizing fluid is a gas.

4. The method for measuring contaminant mobile ions in the dielectric portion of the semiconductor of claim 1, wherein said mobilizing fluid is comprised of hydrogen gas.

5. The method for measuring contaminant mobile ions in the dielectric portion of the semiconductor of claim 4, wherein said mobilizing fluid is further comprised of nitrogen gas.

6. The method for measuring contaminant mobile ions in the dielectric portion of the semiconductor of claim 5, wherein the mobilizing fluid is comprised of approximately ten percent hydrogen gas and approximately ninety percent nitrogen gas.

7. The method for measuring contaminant mobile ions in the dielectric portion of the semiconductor of claim 4, wherein said mobilizing fluid is further comprised of helium gas.

8. The method for measuring contaminant mobile ions in the dielectric portion of the semiconductor of claim 1, wherein said measuring the contaminant mobile ions is comprised of biasing of the mobile ions within the dielectric portion.

9. The method for measuring contaminant mobile ions in the dielectric portion of the semiconductor of claim 1, wherein the temperature of the dielectric portion is elevated to approximately four hundred degrees Celsius (400° C.).

10. The method for measuring contaminant mobile ions in the dielectric portion of the semiconductor of claim 1, wherein the semiconductor is a silicon semiconductor wafer and the dielectric portion is at least partially silicon dioxide.

11. The method for measuring contaminant mobile ions in the dielectric portion of the semiconductor of claim 1, wherein the heating of the dielectric portion and exposing the dielectric portion to the mobilizing fluid are performed in a mobilization unit that includes a furnace.

12. A method for measuring contaminant mobile ions in a dielectric portion of a semiconductor wafer, comprising:
    elevating a temperature of the dielectric portion of the semiconductor;
    exposing the dielectric portion of the semiconductor wafer to a mobilizing fluid after elevating the temperature of the dielectric portion, the mobilizing fluid including hydrogen gas for assisting in mobilizing the contaminant mobile ions within the dielectric portion of the semiconductor wafer; and
    inducing at least one electric potential across a surface of the dielectric portion of the semiconductor and measuring the contaminant mobile ions within the dielectric portion of the semiconductor wafer after elevating the temperature of the dielectric portion of the semiconductor wafer and after exposing the dielectric portion of the semiconductor to the mobilizing fluid, said measuring the contaminant mobile ions within the dielectric portion of the semiconductor conducted after forming the dielectric portion on a substrate of the semiconductor wafer.

13. The method for measuring contaminant mobile ions in the dielectric portion of the semiconductor wafer of claim 12, wherein said mobilizing fluid is a gas.

14. The method for measuring contaminant mobile ions in the dielectric portion of the semiconductor wafer of claim 12, wherein said mobilizing fluid is comprised of hydrogen gas.

15. The method for measuring contaminant mobile ions in the dielectric portion of the semiconductor wafer of claim 14, wherein said mobilizing fluid is further comprised of nitrogen gas.

16. The method for measuring contaminant mobile ions in the dielectric portion of the semiconductor wafer of claim 15, wherein the mobilizing fluid is comprised of approximately ten percent hydrogen gas and approximately ninety percent nitrogen gas.

17. The method for measuring contaminant mobile ions in the dielectric portion of the semiconductor wafer of claim 14, wherein said mobilizing fluid is further comprised of helium gas.

18. The method for measuring contaminant mobile ions in the dielectric portion of the semiconductor wafer of claim 12, wherein the measuring the contaminant mobile ions within the dielectric portion of the semiconductor wafer is comprised of biasing of the mobile ions within the dielectric portion.

19. The method for measuring the contaminant mobile ions in the dielectric portion of the semiconductor wafer of claim 12, wherein the temperature of the dielectric portion is elevated to approximately four hundred degrees Celsius (400° C.).

20. The method for measuring the contaminant mobile ions in the dielectric portion of the semiconductor wafer of claim 12, wherein the dielectric portion is at least partially silicon dioxide.

* * * * *